United States Patent
Koike et al.

(10) Patent No.: US 7,176,052 B2
(45) Date of Patent: Feb. 13, 2007

(54) CAPACITOR, CIRCUIT BOARD, METHOD OF FORMATION OF CAPACITOR, AND METHOD OF PRODUCTION OF CIRCUIT BOARD

(75) Inventors: Hiroko Koike, Nagano (JP); Takashi Mochizuki, Shiojiri (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 184 days.

(21) Appl. No.: 11/068,884

(22) Filed: Mar. 2, 2005

(65) Prior Publication Data

US 2005/0144767 A1 Jul. 7, 2005

Related U.S. Application Data

(62) Division of application No. 10/645,478, filed on Aug. 22, 2003, now Pat. No. 6,890,792.

(30) Foreign Application Priority Data

Aug. 27, 2002 (JP) ............................. 2002-247357

(51) Int. Cl.
*H01L 51/40* (2006.01)
*H01L 21/8242* (2006.01)
(52) U.S. Cl. .................. 438/99; 438/239; 438/240; 438/957; 29/25.03; 257/E21.01
(58) Field of Classification Search ............... 438/99, 438/239, 240, 957, FOR. 135, FOR. 430; 29/25.03; 257/E21.01
See application file for complete search history.

(56) References Cited

U.S. PATENT DOCUMENTS

| 4,609,971 | A | 9/1986 | Shaffer |
| 4,729,844 | A | 3/1988 | Tsuchiya et al. |
| 4,982,312 | A | 1/1991 | Shindo et al. |
| 5,972,052 | A | 10/1999 | Kobayashi et al. |
| 6,454,817 | B1 | 9/2002 | Shin et al. |
| 6,498,714 | B1 | 12/2002 | Fujisawa et al. |
| 6,882,520 | B2 * | 4/2005 | Kamigawa et al. ......... 361/523 |
| 6,919,240 | B2 * | 7/2005 | Uzawa et al. ............... 438/171 |

* cited by examiner

*Primary Examiner*—George Fourson
*Assistant Examiner*—Thanh V. Pham
(74) *Attorney, Agent, or Firm*—Staas & Halsey LLP

(57) ABSTRACT

A method of formation of a capacitor forming part of an electric circuit when producing a circuit board, consisting of forming a valve metal bottom electrode layer and a valve metal oxide dielectric layer on the same, then integrally forming a solid electrolyte layer comprised of an organic semiconductor and a top electrode layer comprised of metal on the same, this integral formation step consisting of the step of holding one surface of metal foil for the top electrode at a bonding wedge and making the other surface of the metal foil carry a powder of the organic semiconductor by compression bonding and heating and the step of compression bonding the organic semiconductor powder carried by compression bonding at the dielectric layer by a bonding wedge through metal foil, whereby a solid electrolyte layer comprised of an organic semiconductor sandwiched between the metal foil and dielectric layer and closely bonded with the two is formed, a capacitor built into a circuit board, a circuit board including a capacitor, and a method of production of the circuit board.

2 Claims, 7 Drawing Sheets

CAPACITOR, CIRCUIT BOARD, METHOD OF FORMATION OF CAPACITOR, AND METHOD OF PRODUCTION OF CIRCUIT BOARD

CROSS-REFERENCE TO RELATED APPLICATION

This application is a divisional of U.S. application Ser. No. 10/645,478, filed Aug. 22, 2003 now U.S. Pat. No. 6,890,792 and claims priority to Japanese Application No. 2002-247357, and incorporated by reference herein.

BACKGROUND OF THE INVENTION

1. Field of the Invention

The present invention relates to a capacitor forming part of the electric circuit of a circuit board, a circuit board including such a capacitor, and methods of production of the same. The circuit board including a capacitor of the present invention forms a semiconductor module (semiconductor package) mounting a semiconductor chip.

2. Description of the Related Art

Semiconductor modules are being made increasingly denser in many applications. In accordance with this, when providing interconnect patterns in close proximity, it is important to prevent crosstalk noise between interconnects and fluctuations in potential of power lines etc. In particular, in the case of a semiconductor package mounting a high frequency semiconductor chip required for high speed switching operations, crosstalk noise occurs more easily along with a rise in the frequency. Further, high speed on/off operations of switching elements also cause switching noise. Due to this, the potential of the power lines etc. fluctuates more easily.

In the past, as means for eliminating such problems, a separate chip capacitor or other capacitor was mounted in a semiconductor package as a bypass capacitor for eliminating unnecessary coupling between circuits by signal lines or power lines (decoupling).

The method of the related art, however, suffered from the following problems. First, the degree of freedom of design of the interconnect patterns falls along with mounting of a separate chip capacitor etc.

Further, if the interconnect distance connecting a chip capacitor and semiconductor chip is long, the inductance becomes larger and the decoupling effect of the chip capacitor can no longer be obtained. Therefore, the chip capacitor etc. has to be mounted in as close proximity to the semiconductor chip as possible. The size of the chip capacitor etc., however, restricts the mounting position, so there were also limits to the proximity of arrangement with respect to the semiconductor chip.

Further, if mounting a chip capacitor or other capacitor in a semiconductor package, the package unavoidably becomes larger in size and heavier in weight. This runs counter to the current trend of the reduction of size and weight. In this regard as well, there were limits to measures through reduction of size of the chip capacitor etc.

The present assignee proposed a structure including a capacitor in a circuit board to solve the above problem of the related art in Japanese Patent Application No. 2001-57281. In this structure, the capacitor arranged between interconnect layers in the circuit board is comprised of a bottom electrode layer comprised of a valve metal, a dielectric layer comprised of an oxide of a valve metal, a solid electrolyte layer, and a top electrode layer stacked in that order.

The structure of the prior application eliminates the problem in the conventional structure mounting a chip capacitor separately on a circuit board by incorporating the capacitor in the circuit board, enables freedom of design of the interconnect patterns to be secured, greatly improves the degree of proximity between the capacitor and the semiconductor chip, and enables a reduction of the size and weight of the package.

The structure of the prior application, however, leaves room for further improvement in the production process, in particular the method of formation of the solid electrolyte layer. That is, in the process of production of the prior application, the solid electrolyte layer was formed by one of the following:

(1) formation by polypyrrole, a conductive polymer, by coating and thermal decomposition of a polymer, (2) formation by a conductive polymer by electrolytic polymerization (3) formation by stannous oxide or another conductive metal oxide by chemical vapor deposition (CVD) etc.

These methods of formation had room for improvement in the following respects: First, in the methods of formation of (1) and (2), polymers are formed using a liquid of a monomer solution, oxidizing agent, or electrolytic polymerization solution, so it is difficult to form the polymer in a predetermined shape at a predetermined position on the substrate.

Further, in the method of formation of (3), by using electrodeposition etc., the problem arising due to use of a liquid as explained above is solved, but the electroconductivity of a metal oxide is low, so obtaining a low ESR capacitor is difficult. The ESR, that is, the equivalent series resistance, is the resistance of the capacitor itself. If the ESR becomes high, the high frequency characteristics of the capacitor deteriorate.

To eliminate the problems in the preceding application, the present assignee studied a method for formation of a solid electrolyte layer using a powder of an organic semiconductor such as TCNQ. This method will be explained with reference to FIGS. 1A to 1H. This method, however, has not been published up to now and is first disclosed in this application.

First, as shown in FIG. 1A, a pad 102 of a substrate 100 formed with an interconnect pattern is formed with a bottom electrode 104 by sputtering or electrodeposition of Al or Ta. The pad 102 is a part of the interconnect pattern on the substrate 100 formed wider.

Next, as shown in FIG. 1B, the top surface of the bottom electrode 104 is formed with a resist layer 106 as a mask for defining a dielectric layer formation region.

Next, as shown in FIG. 1C, the top surface of the bottom electrode 104 is anodically oxidized to form a dielectric layer ($Al_2O_3$ or $Ta_2O_5$) 108.

Next, as shown in FIG. 1D, the dielectric layer 108 is supplied with powder 110' of the TCNQ complex.

Next, a solid electrolyte layer 110 on the dielectric layer 108 and top electrode 114 on the same are formed by the following method 1 or method 2.

Method 1

The steps of FIG. 1E1 and FIG. 1F are successively performed. First, as shown in FIG. 1E1, the dielectric layer 108 is formed with a solid electrolyte layer 110 comprised of a TCNQ complex. In this case, the substrate 100 is heated by a heater 112 to heat and melt the TCNQ complex powder 110', then the heating is stopped and the substrate is allowed to naturally cool, whereby a TCNQ complex layer (solid electrolyte layer) 110 is formed as an integral melt-solidified layer. Next, as shown in FIG. 1F, the top electrode 114 is formed by sputtering of Cu or another metal. Due to this, a capacitor comprised of the bottom electrode 104, dielectric layer 108, solid electrolyte layer 110, and top electrode 114 stacked in that order is completed.

Method 2

As shown in FIG. 1E2, a Cu or other metal foil 114 is held by suction etc. at a bonding wedge 116 and placed on the TCNQ complex powder 110'. By thermo compression bonding by the bonding wedge 116, in the same way as that shown in FIG. 1F, the TCNQ complex layer (solid electrolyte layer) 110 and the top electrode layer 114 on it are simultaneously formed. Due to this, a capacitor comprised of the bottom electrode 104, dielectric layer 108, solid electrolyte layer 110, and top electrode 114 stacked in that order is completed.

After the capacitor is completed by the above, as shown in FIG. G, the resist layer 106 is removed.

Next, as shown in FIG. 1H, an insulating layer 118 is formed to bury the capacitor by coating an insulating resin or laminating a resin film.

Finally, the insulating layer 118 is formed with vias and interconnect patterns required for a predetermined circuit and the top electrode 114 and interconnect patterns are electrically connected, whereby the circuit board is completed.

Note that in the above example, the pad 102 was shown as part of the interconnect pattern formed on the substrate 100, but the pad 102 may also be formed as part of the interconnect pattern of one layer in the multilayer interconnect structure formed on the board 100 and electrically connected with the bottom interconnect pattern.

According to the methods studied above, the problem with controllability of the position of formation and shape of formation as in the case of forming a polymer using a liquid as in the method disclosed in the preceding application does not arise. Further, the problem of the higher ESR arising due to the low electroconductivity as in the case of use of a conductive metal oxide does not arise.

However, there is a problem that when supplying powder 110' of the TCNQ complex on the dielectric layer 108, the amount of supply of the powder becomes uneven in the plane of the dielectric layer 108.

In addition, there is the following problem in the formation of the solid electrolyte layer 110. That is, with the above method 1, when heating the substrate 100, the molten TCNQ complex is liable to flow outside of the region defined by the resist 106. On the other hand, with the above method 2, when pressing the powder 110', mechanical damage ends up being caused to the dielectric layer 108 at the bottom.

SUMMARY OF THE INVENTION

An object of the present invention is to solve the problems in the above processes and thereby enable the advantages of the circuit board including a capacitor proposed in the preceding application to be exerted to the maximum extent and to provide a method of formation of a capacitor in a circuit board for a semiconductor package eliminating the problems of the related art, securing freedom in design of the interconnect patterns, greatly improving the degree of proximity of the capacitor and semiconductor chip, and enabling a reduction of the size and weight, a method of production of a circuit board for forming an internal capacitor by the same, a capacitor formed by these, and a circuit board including the capacitor.

To attain the above object, according to a first aspect of the present invention, there is provided a method of formation of a capacitor forming part of an electric circuit when producing a circuit board with that electric circuit built in, including the steps of forming at a scheduled position for formation of the capacitor of the circuit board in the process of production a bottom electrode layer comprised of at least one type of valve metal selected from the group comprised of aluminum, tantalum, niobium, tungsten, vanadium, bismuth, titanium, zirconium, and hafnium; forming on the bottom electrode layer a dielectric layer comprised of an oxide of at least one type of valve metal selected from the group; and integrally forming on the dielectric layer a solid electrolyte layer comprised of an organic semiconductor and a top electrode layer comprised of metal on top; the step of integrally forming on the dielectric layer the solid electrolyte layer and top electrode layer including the steps of making one surface of the top electrode metal foil carry powder of the organic semiconductor by compression bonding and forming a solid electrolyte layer comprised of the organic semiconductor sandwiched between the metal foil and the dielectric layer and closely bonded to the two by thermo compression bonding of organic semiconductor powder carried by compression bonding on the dielectric layer through the metal foil.

According to a second aspect of the invention, there is provided a method of formation of a capacitor forming part of an electric circuit when producing a circuit board with that electric circuit built in, including the steps of forming at a scheduled position for formation of the capacitor of the circuit board in the process of production a bottom electrode layer comprised of at least one type of valve metal selected from the group comprised of aluminum, tantalum, niobium, tungsten, vanadium, bismuth, titanium, zirconium, and hafnium; forming on the bottom electrode layer a first dielectric layer comprised of an oxide of at least one type of valve metal selected from the group; integrally forming on the first dielectric layer a solid electrolyte layer comprised of an organic semiconductor, a second dielectric layer comprised of an oxide of at least one type of valve metal selected from the above group, a second layer of at least one type of valve metal selected from the above group, and a top electrode layer comprised of metal on top; the step of integrally forming on the first dielectric layer the solid electrolyte layer, second dielectric layer, valve metal second layer, and top electrode layer including the steps of forming on one surface of the top electrode metal foil the valve metal second layer; forming on the valve metal second layer a second dielectric layer; making a free surface of the second dielectric layer formed on the valve metal second layer on the metal foil carry powder of the organic semiconductor by compression bonding; and forming a solid electrolyte layer comprised of the organic semiconductor sandwiched between the second dielectric layer formed on the valve metal second layer on the metal foil and the first dielectric layer and closely bonded to the two by thermo compression bonding of organic semiconductor powder carried by compression bonding on the dielectric layer through the metal foil.

According to the method of the first aspect and second aspect of the invention, a polar capacitor and nonpolar capacitor are formed.

A multiterminal structure capacitor may also be formed by the method of the first aspect and second aspect of the invention. That is, the method of the first aspect of the invention further comprises forming on the bottom electrode layer a plurality of parallel dielectric layers and integrally forming on each of the individual dielectric layers a solid electrolyte layer comprised of an organic semiconductor and a top electrode layer comprised of metal on top.

Further, the method of the second aspect of the invention comprises forming on the bottom electrode layer a plurality of parallel first dielectric layers and integrally forming on each of the individual first dielectric layers a solid electrolyte layer comprised of an organic semiconductor, a second dielectric layer comprised of an oxide of at least one type of valve metal selected from the above group, a second layer of at least one type of valve metal selected from the above group, and a top electrode layer comprised of metal on top.

In the method of the first aspect and second aspect of the invention, as the organic semiconductor forming the solid electrolyte layer, typically a tetracyanoquinone dimethane (TCNQ) complex is used.

The present invention may also provide a capacitor formed by a method of the first aspect of the invention or second aspect of the invention.

The present invention may also provide a method of production of a circuit board using the method of formation of a capacitor of the first aspect of the invention or the second aspect of the invention and a circuit board produced by the same.

BRIEF DESCRIPTION OF THE DRAWINGS

These and other objects and features of the present invention will become clearer from the following description of the preferred embodiments given with reference to the attached drawings, wherein:

FIG. 1A to 1H are sectional views of the steps of production of a circuit board with a built-in capacitor by an unpublished method which the present assignee studied before the present invention;

DESCRIPTION OF THE PREFERRED EMBODIMENTS

Figure 1A:
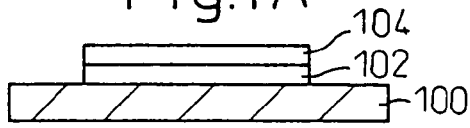

Preferred embodiments of the present invention will be described in detail below while referring to the attached figures.

In the present invention, the bottom electrode layer is comprised of at least one type of valve metal selected from the group comprised of aluminum (Al), tantalum (Ta), niobium (Nb), tungsten (W), vanadium (V), bismuth (Bi), titanium (Ti), zirconium (Zr), and hafnium (Hf). The valve metal is a metal by which an oxide film is formed by anodic oxidation. The oxide film produced has a valve action not passing a current in a certain direction.

As the bottom electrode layer, it is possible to use one type of the above valve metals alone or use two or more types in the form of an alloy, mixture, etc. Further, it is possible to use these in the form of a mixture of compounds of the valve metals, mixtures of compounds and alloys of the valve metals, alloys of the valve metals and other metals, etc. As the bottom electrode layer of the present invention, in particular Ta, Al, etc. are suitable.

The bottom electrode layer may be formed using the thin film formation technology ordinarily used for the production of a semiconductor module etc. As a typical film formation method, vacuum deposition, sputtering, CVD, etc. may be mentioned.

The bottom electrode layer is formed with a dielectric layer comprised of an oxide of a valve metal. This valve metal may be the same or different as the valve metal forming the bottom electrode layer. If the same type of valve metal as the bottom electrode layer is used, it is possible to form a dielectric layer by oxidation of the bottom electrode layer by anodic oxidation etc., so this is desirable for simplification of the process. When using a valve metal different in type from the bottom electrode layer, it is deposited on the bottom electrode as an oxide by a suitable film formation method such as the above. As the dielectric layer of the present invention, in particular an oxide of Ta, Al, etc. ($Ta_2O_5$, $Al_2O_3$, etc.) is suitable.

The characterizing feature of the present invention lies in the integral formation of the solid electrolyte layer and top electrode layer on the dielectric layer. Specifically, by holding one surface of a metal foil for the top electrode by a bonding wedge by suction etc., making the other surface of the metal foil carry powder of the solid electrolyte organic semiconductor by compression bonding, and thermo compression bonding this to the dielectric layer by the bonding wedge through the metal foil, a solid electrolyte layer comprised of an organic semiconductor comprised of metal foil and a dielectric layer closely bonded is formed.

Due to this, it is possible to integrally form a solid electrolyte layer of a predetermined shape and a top electrode layer on it at a predetermined position on the dielectric layer. That is, since the powder of the organic semiconductor forming the solid electrolyte layer is carried by compression bonding on the surface of the metal foil for forming the top electrode and is thermo compression bonded on the dielectric layer, it is possible to form a solid electrolyte layer of a predetermined planar shape defined by the shape of the metal foil at a predetermined position on the dielectric layer.

Therefore, the problem with controllability of the position of formation and shape of formation as in the case of forming a polymer using a liquid as in the method disclosed in the preceding application does not arise. Further, the problem of the higher ESR arising due to the low electroconductivity as in the case of use of a conductive metal oxide does not arise.

As the method of formation of the solid electrolyte layer using the powder of the organic semiconductor, the method of formation by placing the organic semiconductor powder on the dielectric layer and heating it to melt may also be considered. This method however suffers from a problem in the following point.

That is, since fluctuations in the amount of supply of the organic semiconductor powder and outflow at the time of heating and melting easily occur, it is difficult to form a solid electrolyte layer in a predetermined position by a predetermined shape.

According to the method of the present invention, one surface of the metal foil is held by the bonding wedge and the organic semiconductor powder carried by compression bonding on the other surface of the metal foil is thermo compression bonded by the bonding wedge on the dielectric layer, so it is possible to form a solid electrolyte layer by heating only the compression bonding locations in an extremely short time. The other parts of the circuit board are not affected by the heating.

In the present invention, an organic semiconductor is used as the material forming the solid electrolyte layer. As this organic semiconductor, a TCNQ complex is most suitable. The TCNQ complex is melted by heating to 230 to 240° C. or so, then is solidified, whereby a solid electrolyte layer comprised of TCNQ complex is formed as an integral melt-solidified layer. Further, by thermo compression bonding consisting of heating under pressure, the underlying dielectric layer can be closely bonded. From a general viewpoint, as the material making up the solid electrolyte layer, pyrrole or another electroconductive polymer material may be considered, but these will not melt, but will end up decomposing upon heating, so are not suitable for the method of the present invention.

In the present invention, the organic semiconductor is used in the powder state. Here, "powder" is sufficiently a state enabling carriage by compression bonding on the metal foil for the top electrode. It includes not only the state generally referred to as "powder", but also the state referred to as "granules" etc. Below, specific embodiments of the present invention will be explained with reference to the attached drawings.

First Embodiment

Figure 2A:
FIGS. 2A to 2I are sectional views of the steps of production of a polar capacitor and a circuit board with such built-in by the method of a first embodiment of the present invention.

FIGS. 2A to 2I show steps of formation of a polar capacitor according to an embodiment of the first aspect of the invention. First, as shown in FIG. 2A, a pad 102 of the substrate 100 formed with the interconnect pattern is formed with a bottom electrode 104 by sputtering, electrodeposition, etc. of a valve metal Al, Ta, etc. The pad 102 is a part of the interconnect pattern on the substrate 100 formed wide.

Figure 2B:
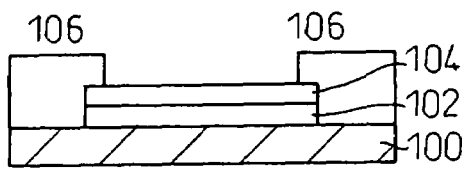

Next, as shown in FIG. 2B, the top surface of the bottom electrode 104 is formed with a resist layer 106 as a mask for defining the dielectric layer formation region.

Figure 2C:
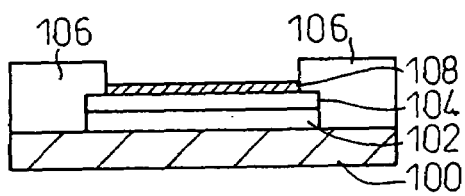

Next, as shown in FIG. 2C, the top surface of the bottom electrode 104 is anodically oxidized to form a dielectric layer ($Al_2O_3$ or $Ta_2O_5$) 108.

Figure 1B:
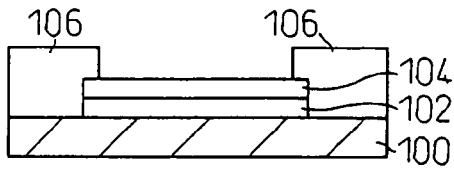
Figure 1C:
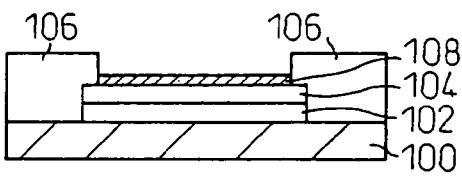
Figure 1D:
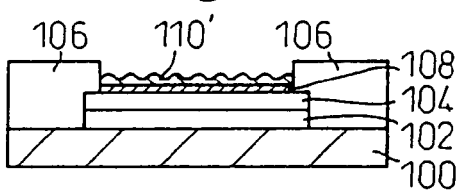
Figure 1F:
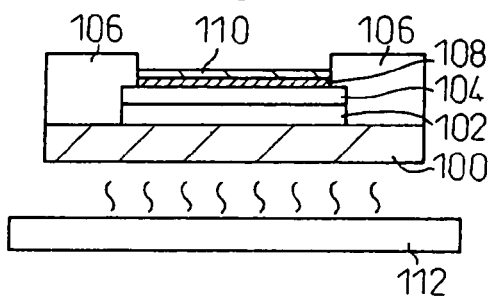
Figure 1F:
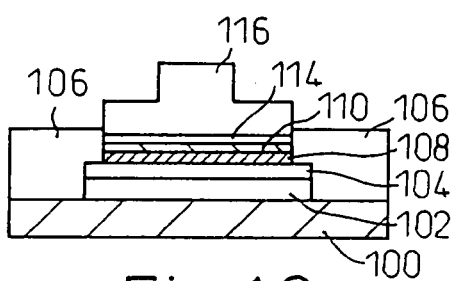
Figure 1F:
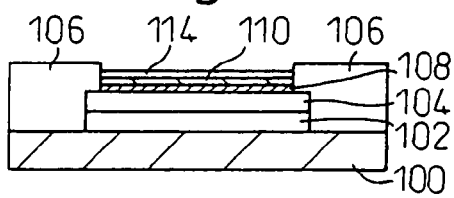
Figure 1G:
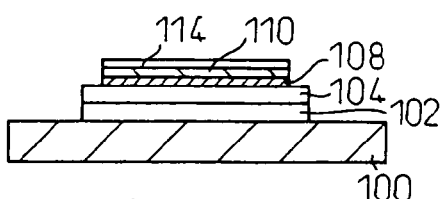
Figure 1H:
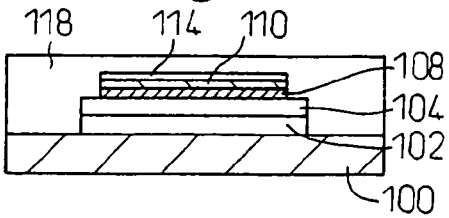

The above steps are the same as the conventional steps shown in FIGS. 1A to 1C. The present invention is characterized by the step of integrally forming the solid electrolyte layer and top electrode layer on the top explained below.

Figure 3A:
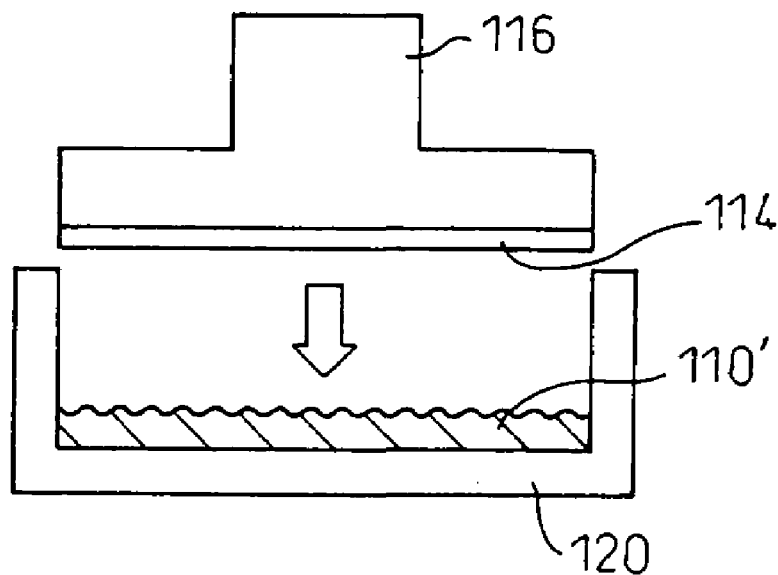
FIGS. 3A and 3B are sectional views of the preparatory steps for integrally forming a solid electrolyte layer and top electrodes according to the present invention on a dielectric layer on a bottom electrode in the method of FIGS. 2A to 2I.

Here, the preparatory step for integral formation will be explained with reference to FIGS. 3A and 3B. As shown in FIG. 3A, a Cu or other metal foil 114 is held at a bonding wedge 116 by suction, lowered as shown by the arrow in the container 120, then pushed against the TCNQ complex powder 110' accommodated in a container 120, whereby the metal foil 114 is made to carry the TCNQ complex powder 110' by compression bonding. This compression bonding is performed at ordinary temperature.

Figure 3B:
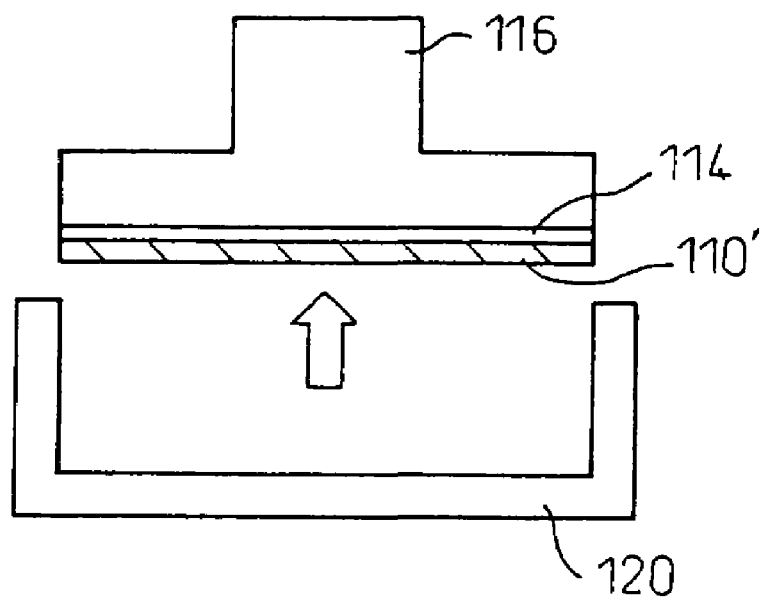

As shown in FIG. 3B, when the bonding wedge 116 is raised, since the top surface of the metal foil 114 is held by the bonding wedge 116, the TCNQ complex powder 110' is pulled up carried by compression bonding on the bottom surface of the metal foil 114.

Figure 2D:
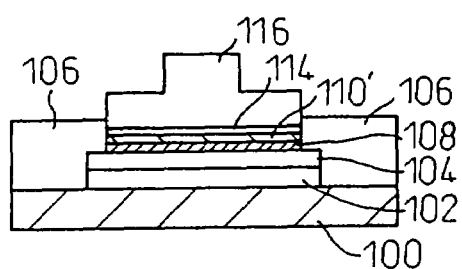

The integral formation step will be explained next referring to FIGS. 2D to 2I. As shown in FIG. 2D, the metal foil 114 on the bottom surface of which the TCNQ complex powder 110' is carried by compression bonding is held by the bonding wedge 116, is brought into contact with the top surface of the dielectric layer 108 formed on the bottom electrode 104, and is thermo compression bonded by the bonding wedge 116.

Figure 2E:
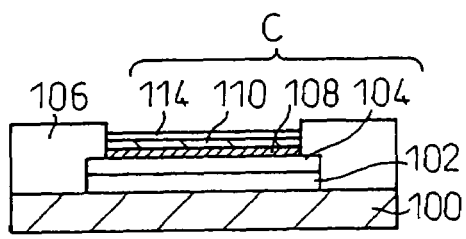

Due to this, as shown in FIG. 2E, a capacitor C comprised of the bottom electrode 104, dielectric layer 108, solid electrolyte layer 110, and top electrode 114 stacked in that order is completed.

Figure 2F:
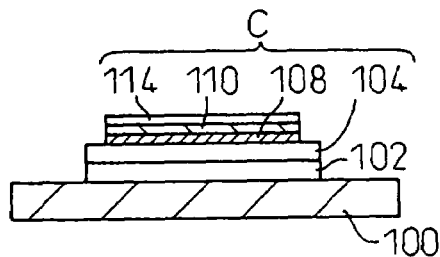

Next, as shown in FIG. 2F, the resist layer 106 is removed.

Figure 2G:
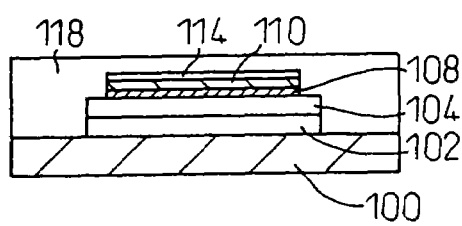

Next, as shown in FIG. 2G, the capacitor C is buried by forming the insulating layer 118 by coating an insulating resin or laminating a resin sheet.

Figure 2H:
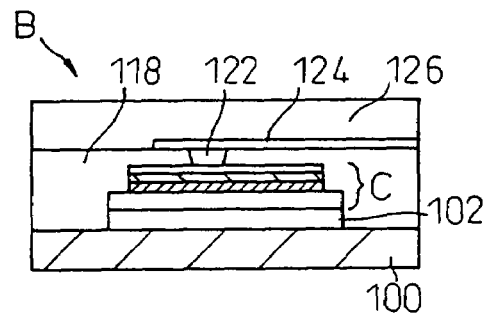

Finally, as shown in FIG. 2H, insulating layer 118 is formed with the via 122 and interconnect pattern 124 (and further if necessary the insulating layer 126) necessary for a predetermined circuit. Due to this, the top electrode 114 of the capacitor C and the interconnect pattern 124 are electrically connected, whereby the circuit board B of the present invention is completed.

Note that in the above example, the pad 102 is shown as part of the interconnect pattern formed on the substrate 100, but the invention is not limited to this.

Figure 2I:
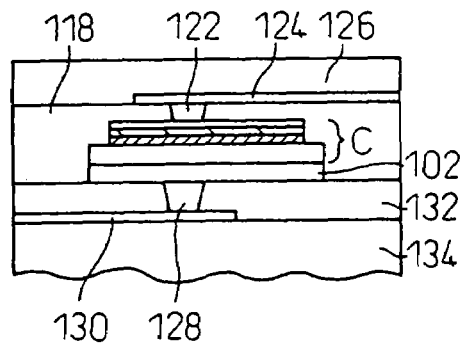

For example, as shown in FIG. 2I, the pad 102 may be formed as part of the interconnect layer of one layer in the multilayer interconnect structure and electrically connected to the bottom interconnect pattern 130 through the via 128. In the figure, 132 and 134 are insulating layers between interconnect layers. Further, the multilayer interconnect structure may be formed on some sort of substrate or may be formed without using a substrate.

The capacitor C formed in the present embodiment is polar. That is, the dielectric layer 108 is formed by an $Al_2O_3$, $Ta_2O_5$, or another oxide film formed by anodically oxidizing the bottom electrode 104 comprised of the valve metal Al, Ta, etc., so has polarity based on the valve action of these oxide films.

Second Embodiment

Figure 4A:
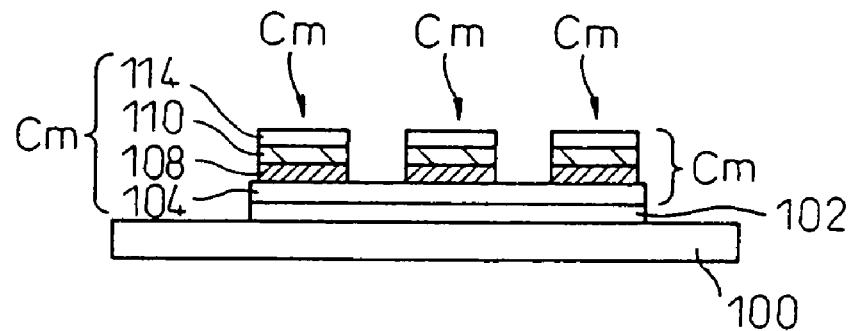
FIGS. 4A and 4B are sectional views of the method of formation of a multipolar structure capacitor and a circuit board with a built-in multipolar structure capacitor in a second embodiment of the present invention.

FIG. 4A shows a multiterminal structure capacitor Cm formed by the method of the first aspect of the invention. The multiterminal structure capacitor Cm is comprised of a single bottom electrode 104 on which a plurality of (three in the figure) dielectric layers 108 are arranged in parallel and a solid electrolyte layer 110 and a top electrode 114 formed on the same formed on the individual dielectric layers 108. By making the capacitor a multiterminal structure, the action of reducing the inductance is obtained.

The multiterminal capacitor Cm of FIG. 4A is obtained by dividing, by etching, the dielectric layer 108, solid electrolyte layer 110, and top electrode 114 formed on the bottom electrode 104 by the steps of FIG. 2A to FIG. 2E in the same way as the first embodiment (division three-way in illustrated example).

Figure 4B:
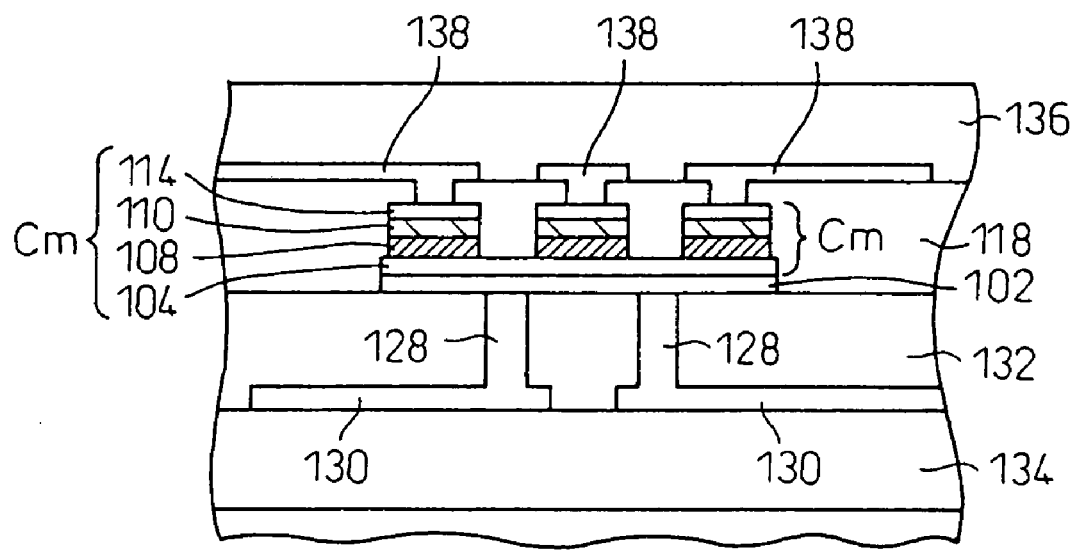

FIG. 4A shows the pad 102 as part of the interconnect pattern formed on the substrate 100, but the invention is not limited to this. For example, as shown in FIG. 4B, the pad 102 may be formed as part of the interconnect pattern of one layer in the multilayer interconnect structure formed on the substrate 100 and electrically connected with the bottom interconnect pattern 130 through a via 128. In the figure, 132 and 134 are insulating layers between interconnect layers.

Third Embodiment

FIGS. 5A to 5I show the steps for formation of a nonpolar capacitor by an embodiment of a second aspect of the invention. The polar capacitor explained in the first embodiment is limited in directions of the anode and cathode. Further, for use of an AC current, a nonpolar capacitor strong against reverse voltage is desirable.

Figure 5A:
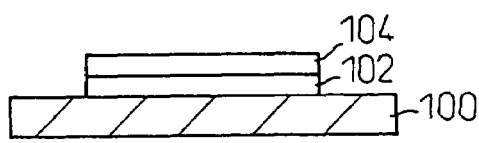
FIGS. 5A to 5I are sectional views of the steps of production of a nonpolar capacitor and a circuit board with it built-in according to the method of a third embodiment of the present invention.

First, as shown in FIG. 5A, a pad 102 of the substrate 100 formed with interconnect patterns is formed with a bottom electrode 104 by sputtering, electrodeposition, etc. of the valve metal Al, Ta, etc. The pad 102 is a part of the interconnect pattern on the substrate 100 formed wider.

Figure 5B:
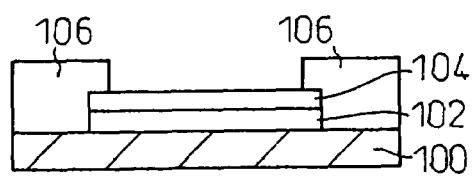

Next, as shown in FIG. 5B, the top surface of the bottom electrode 104 is formed with a resist layer 106 as a mask for defining the dielectric layer formation region.

Figure 5C:
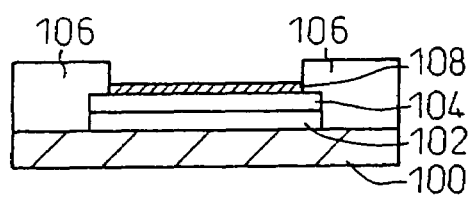

Next, as shown in FIG. 5C, the top surface of the bottom electrode 104 is anodically oxidized to form the dielectric layer ($Al_2O_3$ or $Ta_2O_5$) 108. The above steps are the same as the first embodiment of the first aspect of the invention shown in FIGS. 2A to 2C. The embodiment according to the second aspect of the invention is characterized by the preparatory step for integral formation explained below.

Figure 6A:
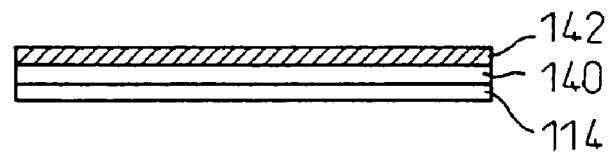
FIGS. 6A to 6C are sectional views of preparatory steps for integrally forming a solid electrolyte layer, dielectric layer, valve metal layer, and top electrode according to the present invention on a dielectric layer of a bottom electrode in the method of FIGS. 5A to 5I.

First, as shown in FIG. 6A, one surface of the Cu or other metal foil 114 is formed with a valve metal layer 140 by sputtering, electrodeposition, etc. of the valve metal Al, Ta, etc., then the surface of the valve metal layer 140 is anodically oxidized to form the dielectric layer ($Al_2O_3$ or $Ta_2O_5$) 142.

Figure 6B:
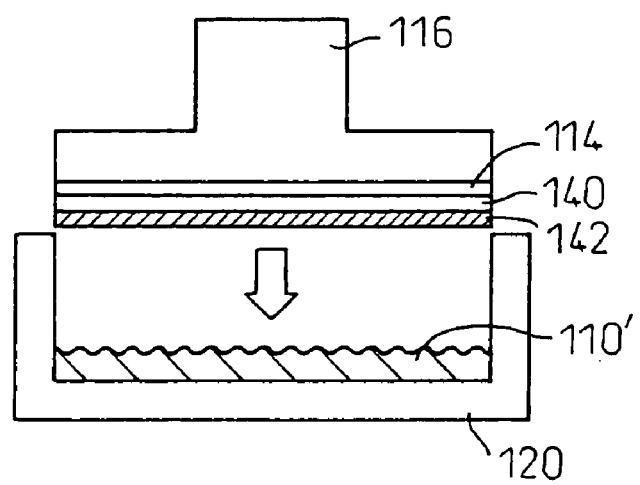

Next, as shown in FIG. 6B, the surface of the metal foil 114 on the opposite side as the surface formed with the dielectric layer 142 is held at the bonding wedge 116 by suction etc., lowered as shown by the arrow in the container 120, and pressed against the TCNQ complex powder 110' accommodated in a container 120, whereby the dielectric layer 142 of the metal foil 114 is made to carry the TCNQ complex powder 110' by compression bonding. This compression bonding is performed at ordinary temperature.

Figure 6C:
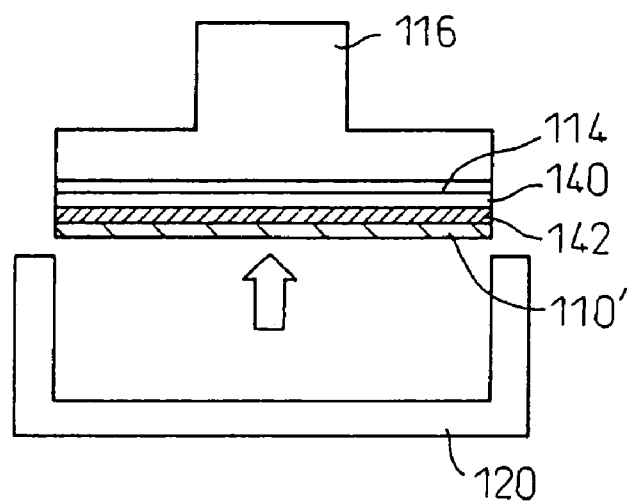

As shown in FIG. 6C, when the bonding wedge 116 is raised, the TCNQ complex powder 110' is pulled up carried by compression bonding on the dielectric layer 142 of the metal foil 114.

Figure 5D:
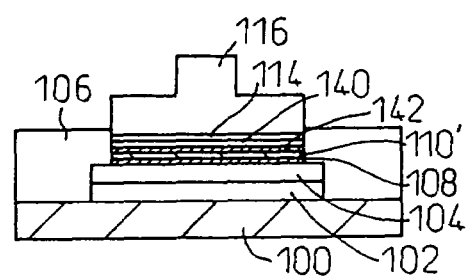

The integral formation step will be explained next referring to FIGS. 5D to 5I. As shown in FIG. 5D, the metal foil 114 on which the TCNQ complex powder 110' is carried by compression bonding is held by the bonding wedge 116, is brought into contact with the top surface of the dielectric layer 108 formed on the bottom electrode 104, and is thermo compression bonded by the bonding wedge 116.

Figure 5E:
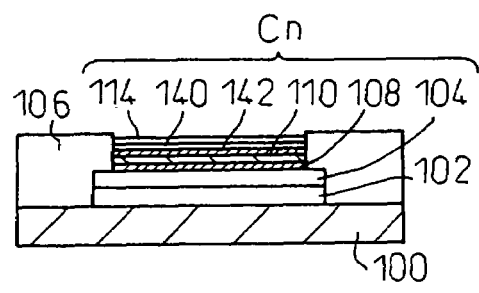

Due to this, as shown in FIG. 5E, a capacitor Cn comprised of the bottom electrode 104, dielectric layer 108, solid electrolyte layer 110, dielectric layer 142, valve metal layer 140, and top electrode 114 stacked in that order is completed.

Figure 5F:
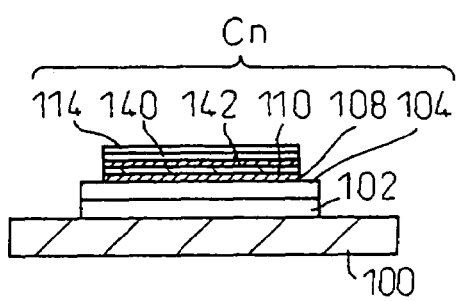

Next, as shown in FIG. 5F, the resist layer 106 is removed.

Figure 5G:
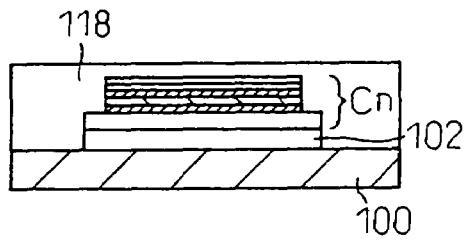

Next, as shown in FIG. 5G, the insulating layer 118 is formed and the capacitor Cn buried by coating an insulating resin or laminating a resin film.

Figure 5H:
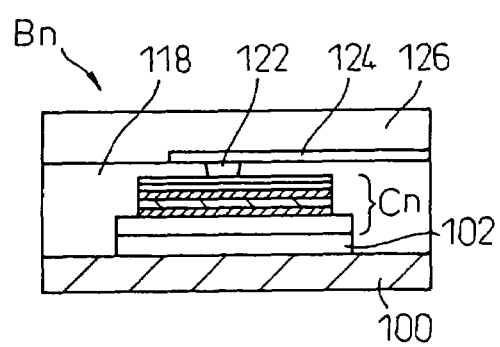

Finally, as shown in FIG. 5H, the insulating layer 118 is formed with a via 122 and interconnect pattern 124 required for the predetermined circuit (and in accordance with need, the insulating layer 126). Due to this, the top electrode 114 of the capacitor Cn and the interconnect pattern 124 are electrically connected, whereby the circuit board Bn of the present invention is completed.

Note that in the above example, the case is shown of using the pad 102 as part of the interconnect pattern formed on the substrate 100, but the invention is not limited to this.

Figure 5I:
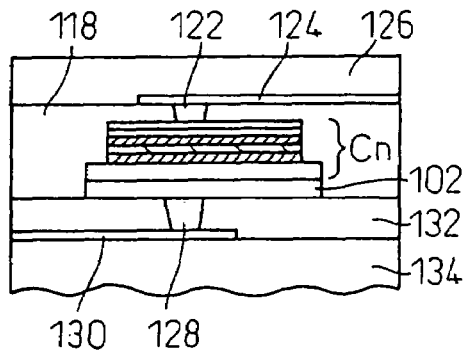

For example, as shown in FIG. 5I, the pad 102 may be formed as part of the interconnect pattern of one layer of the multilayer interconnect structure and be electrically connected with a bottom interconnect pattern 130 through a via 128. In the figure, 132 and 134 are insulating layers between interconnect layers. Further, the multilayer interconnect structure may be formed on some sort of substrate or may be formed without using a substrate.

The capacitor Cn formed in the present embodiment is nonpolar. That is, in the capacitor Cn, the dielectric layer 108 formed on the bottom electrode 104 comprised of the valve metal and the dielectric layer 142 formed on the valve metal layer 140 on the top electrode (metal foil) 114 are arranged facing each other across a solid electrolyte layer 110 sandwiched between the two. The polarity due to the valve action unit on the bottom electrode 104 side (valve metal 104/dielectric layer 108) and polarity due to the valve action unit on the top electrode 114 side (valve metal 140/dielectric layer 142) mutually cancel each other out. No polarity appears at the outside of the capacitor Cn. The capacitor becomes nonpolar. The nonpolar capacitor according to the present embodiment can be made a multiterminal structure capacitor by dividing it in the same way as the polar capacitor of the second embodiment.

Note that in the first to third embodiments, the layers required for integral formation are formed on metal foil 114 of a shape and dimensions matched with the capacitor (capacitor before division in the case of the second embodiment), but it is also possible to form the layers required for integral formation on the metal foil 114, then cut the layers matching with the shape and dimensions of the capacitor. For this cutting, it is also possible to suitably use a dicer for a semiconductor wafer.

Figure 7A:
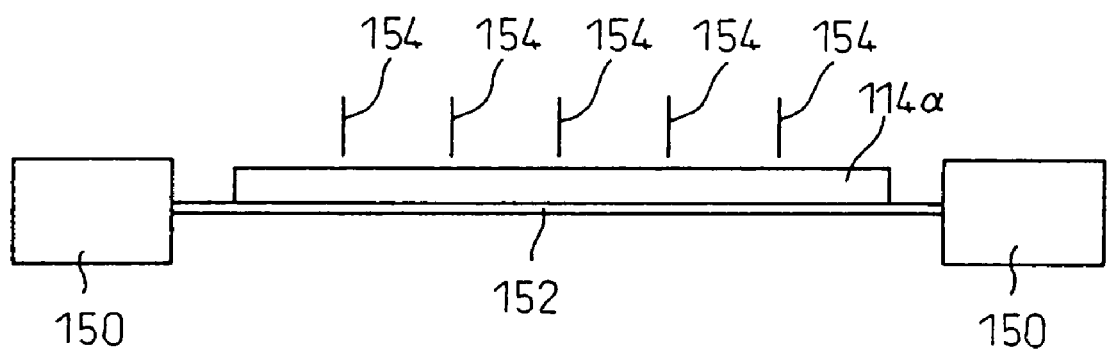
FIGS. 7A and 7B are sectional views of steps used for forming various layers for integral formation on the dielectric layer on the bottom electrode according to the present invention on top electrode metal foil with dimensions larger than the capacitor dimensions, then cutting that layer of the metal foil finished being formed to the capacitor dimensions.
Figure 7B:
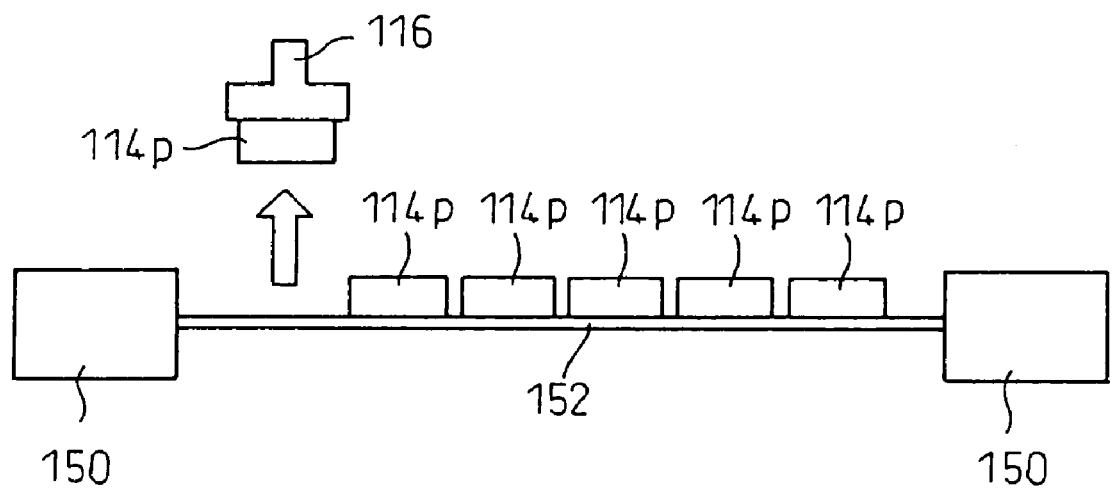

For example, as shown in FIG. 7A, a finished metal foil 114α formed with the layers required for integral formation is adhered to dicing tape 152 stretched over a dicing frame 150 and cut to the necessary dimensions by a dicing blade 154. At this time, as a function of the semiconductor wafer dicer, the dicing tape 152 is not cut. Only the finished metal foil 114α is cut. Next, as shown in FIG. 7B, an individual cut piece 114p of the finished metal foil 114α is held by the bonding wedge 116 and used for integral formation in each embodiment.

Summarizing the effects of the invention, the problem with controllability of the position of formation and shape of formation as in the case of forming a polymer using a liquid as in the method disclosed in the preceding application does not arise. Further, the problem of the higher ESR arising due to the low electroconductivity as in the case of use of a conductive metal oxide does not arise.

Further, compared with the unpublished method studied by the present assignee before the present invention, there is no longer any unevenness in the amount of supply of powder for the solid electrolyte and no mechanical damage occurs to the dielectric layer due to the compression bonding of the powder.

The present invention solves the problems in the above processes and thereby enables the advantages of the capacitor-equipped circuit board proposed in the preceding application to be exerted to the maximum extent and provides a method of formation of a capacitor in a circuit board for a semiconductor package eliminating the problems of the related art, securing freedom in design of the interconnect patterns, greatly improving the degree of proximity of the capacitor and semiconductor chip, and enabling a reduction of the size and weight, a method of production of a circuit board for forming an internal capacitor by the same, a capacitor formed by these, and a circuit board including the capacitor.

While the invention has been described with reference to specific embodiments chosen for purpose of illustration, it should be apparent that numerous modifications could be made thereto by those skilled in the art without departing from the basic concept and scope of the invention.

What is claimed is:

1. A method of formation of a capacitor forming part of an electric circuit when producing a circuit board with that electric circuit built in, including the steps of:

forming at a scheduled position for formation of the capacitor of the circuit board in the process of production a bottom electrode layer comprised of at least one type of valve metal selected from the group comprised of aluminum, tantalum, niobium, tungsten, vanadium, bismuth, titanium, zirconium, and hafnium;

forming on said bottom electrode layer a first dielectric layer comprised of an oxide of at least one type of valve metal selected from said group;

integrally forming on said first dielectric layer a solid electrolyte layer comprised of an organic semiconductor, a second dielectric layer comprised of an oxide of at least one type of valve metal selected from said above group, a second layer of at least one type of valve metal selected from said above group, and a top electrode layer comprised of metal on top;

said step of integrally forming on said first dielectric layer said solid electrolyte layer, second dielectric layer, valve metal second layer, and top electrode layer including the steps of:

forming on one surface of the top electrode metal foil said valve metal second layer;

forming on said valve metal second layer a second dielectric layer;

making a free surface of said second dielectric layer formed on said valve metal second layer on said metal foil carry powder of said organic semiconductor by compression bonding; and forming a solid electrolyte layer comprised of said organic semiconductor sandwiched between said second dielectric layer formed on said valve metal second layer on said metal foil and said first dielectric layer and closely bonded to the two by thermo compression bonding of organic semiconductor powder carried by compression bonding on said dielectric layer through said metal foil.

2. A method of formation of a capacitor as set forth in claim 1, wherein the organic semiconductor forming said solid electrolyte layer is a TCNQ complex.

\* \* \* \* \*

UNITED STATES PATENT AND TRADEMARK OFFICE
CERTIFICATE OF CORRECTION

| | | |
|---|---|---|
| PATENT NO. | : 7,176,052 B2 | Page 1 of 1 |
| APPLICATION NO. | : 11/068884 | |
| DATED | : February 13, 2007 | |
| INVENTOR(S) | : Hiroko Koike et al. | |

It is certified that error appears in the above-identified patent and that said Letters Patent is hereby corrected as shown below:

Column 2, Line 18, change "polymerization" to --polymerization,--.

Column 10, Line 43, after "114α" delete "a".

Signed and Sealed this

Twenty-second Day of May, 2007

JON W. DUDAS
*Director of the United States Patent and Trademark Office*